United States Patent
Shimizu et al.

(10) Patent No.: US 6,396,861 B1
(45) Date of Patent: May 28, 2002

(54) N-TYPE MODULATION-DOPED MULTI QUANTUM WELL SEMICONDUCTOR LASER DEVICE

(75) Inventors: Hitoshi Shimizu, Yokohama; Kouji Kumada; Akihiko Kasukawa, both of Tokyo, all of (JP)

(73) Assignee: The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 09/415,390

(22) Filed: Oct. 8, 1999

(30) Foreign Application Priority Data

Jan. 11, 1999 (JP) .......................................... 11-004497
Apr. 26, 1999 (JP) .......................................... 11-118488

(51) Int. Cl.$^7$ ................................................ H01S 5/00
(52) U.S. Cl. ...................................................... 372/45
(58) Field of Search .................................... 372/45–49

(56) References Cited

U.S. PATENT DOCUMENTS

| | | | | |
|---|---|---|---|---|
| 4,961,197 A | * | 10/1990 | Tanaka et al. | 372/45 |
| 5,331,656 A | * | 7/1994 | Tanaka | 372/45 |
| 5,497,389 A | | 3/1996 | Kasukawa et al. | |

FOREIGN PATENT DOCUMENTS

| | | |
|---|---|---|
| EP | 0 254 568 | 1/1988 |
| JP | 63-32985 | 2/1988 |
| JP | 3-192789 | 8/1991 |
| JP | 4-152583 | 5/1992 |
| JP | 6-310803 | 11/1994 |
| JP | 5-180776 | 3/1995 |
| JP | 7-122812 | 5/1995 |
| JP | 9-232666 | 9/1997 |
| JP | 10-22564 | 1/1998 |
| JP | 10-84170 | 3/1998 |
| JP | 10-126004 | 5/1998 |
| JP | 10-200207 | 7/1998 |

OTHER PUBLICATIONS

Yamamoto, T. "Low Threshold Current Density 1.3–um Strained–Layer Quantum–Well Lasers Using n–Type Modulation Doping". IEEE Photonics Technology Letters, vol. 6, No. 10, Oct. 1994, pp. 1165–1166.*

Kano, F. "Linewidth Enhancement Factor in InGaAsP/InP Modulation–Doped Strained Multiple–Quantum–Well Lasers". IEEE Journal of Quantum Electronics, vol. 30, No. 2, Feb. 1994, pp. 533–537.*

K. Uomi, "Modulation–Doped Multi–Quantum Well (MD–MQW) Lasers. I. Theory", Japanese Journal of Applied Physics, 29, 81–87, (1990) (No month).

* cited by examiner

Primary Examiner—James W. Davie
Assistant Examiner—Davienne Monbleau
(74) Attorney, Agent, or Firm—Frishauf, Holtz, Goodman, Langer & Chick, P.C.

(57) ABSTRACT

An n-type modulation-doped multi quantum well semiconductor laser device having a multi quantum well structure composed of a hetero-junction structure including well layers and barrier layers, characterized in that each of the well layers and each of the barrier layers are formed of an undoped semiconductor material and a semiconductor material modulation-doped with an n-type dopant, respectively, an anti-reflection film and a high-reflection film are formed on the front and rear facets, respectively, the resonator length is not shorter than 800 μm, and mirror loss ($\alpha_m$) given by $$\alpha_m = (1/2L) \ln\{1/(Rf \times Rr)\},$$

where L, Rf and Rr are the cavity length (cm), reflectance of the front facet, and reflectance of the rear facet, respectively, is not higher than 15 cm$^{-1}$. The output of this laser device is higher than that of a conventional undoped MQW semiconductor laser device. The device of the present invention, for use as a 1,480 nm laser device for EDFA excitation, for example, is of great industrial value.

12 Claims, 7 Drawing Sheets

FIG. 5
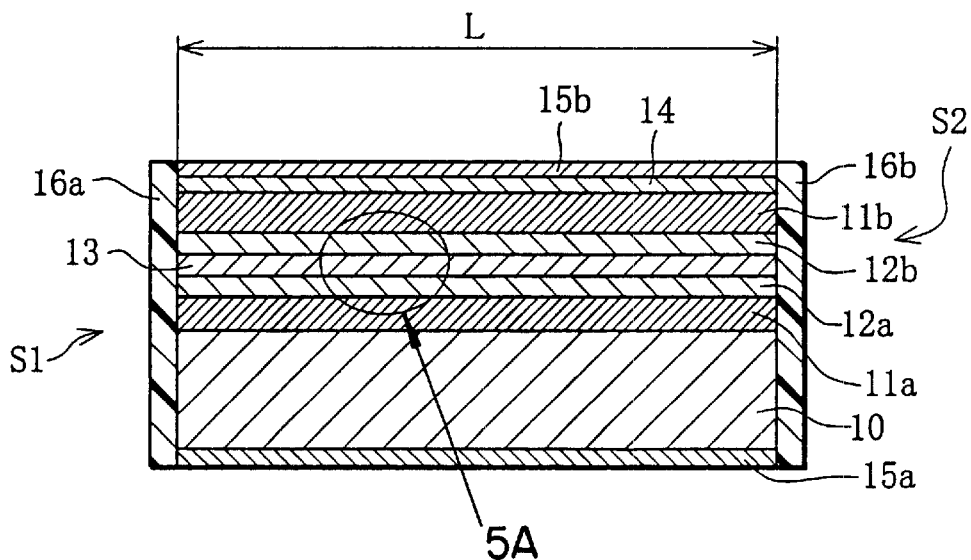
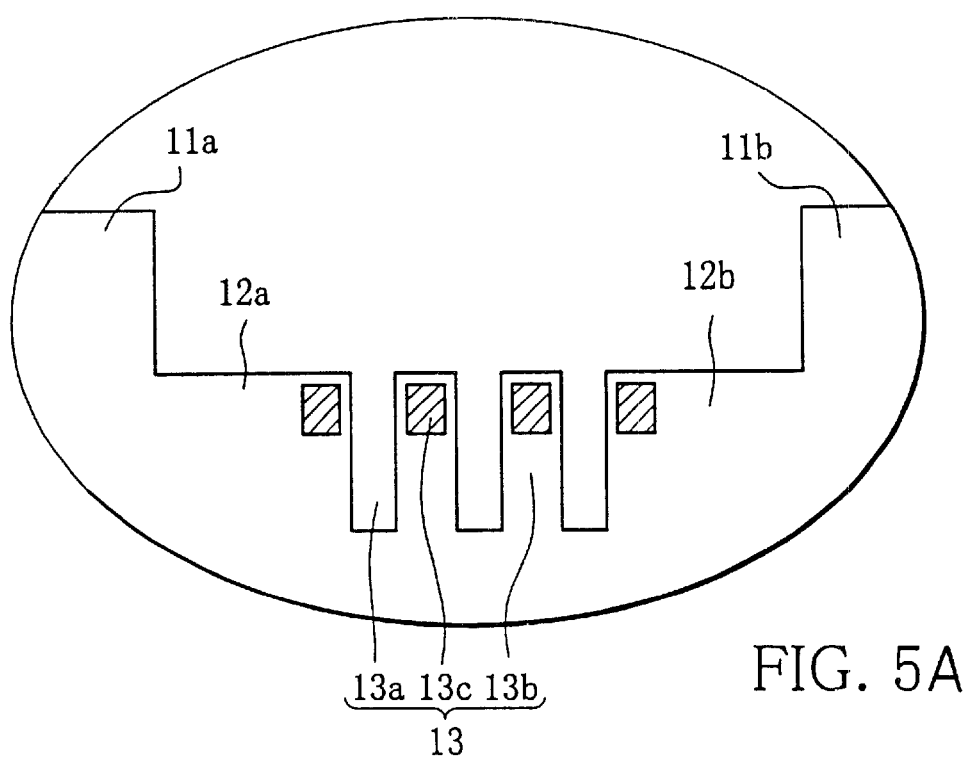
FIG. 5A

FIG. 8
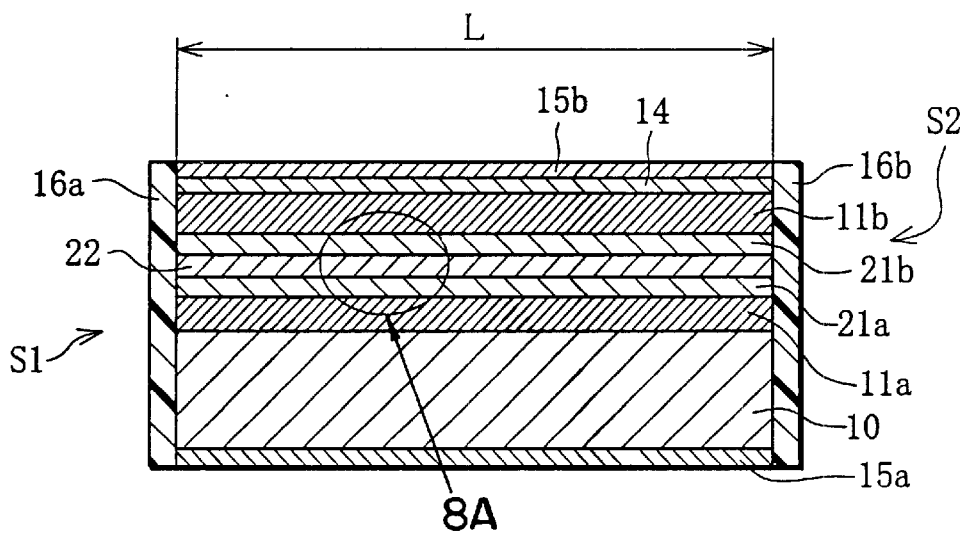
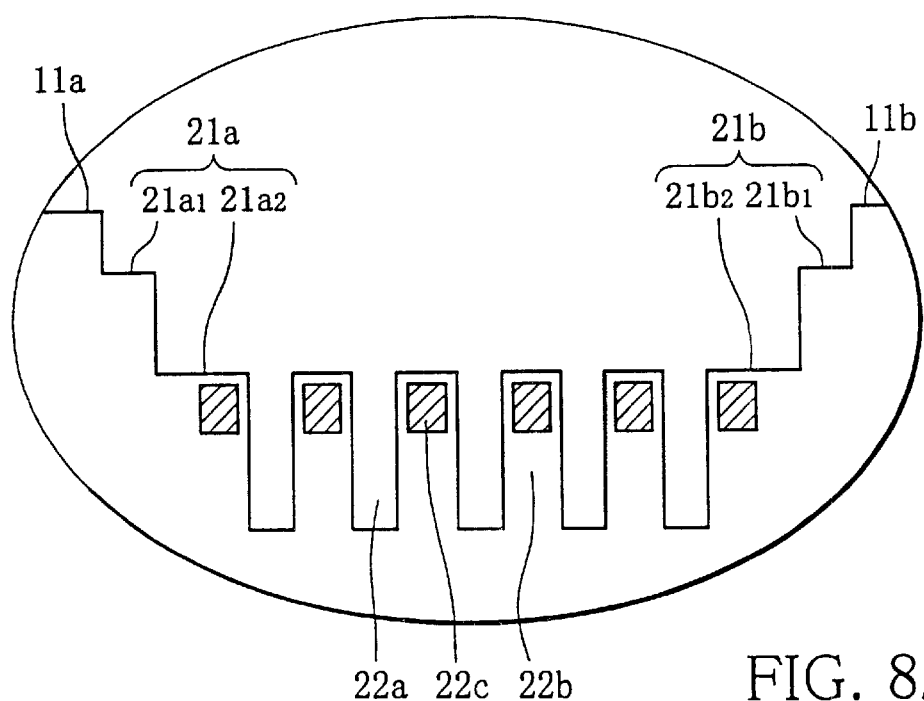
FIG. 8A

FIG. 9
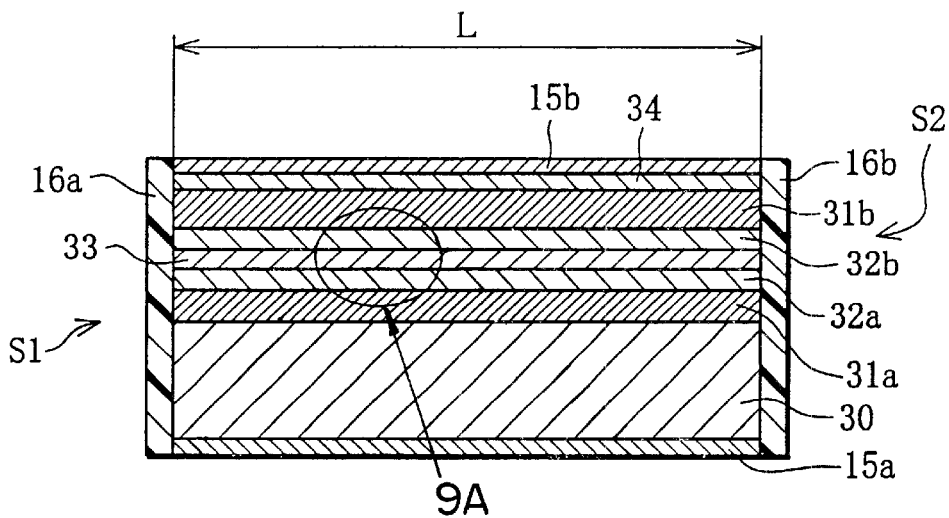
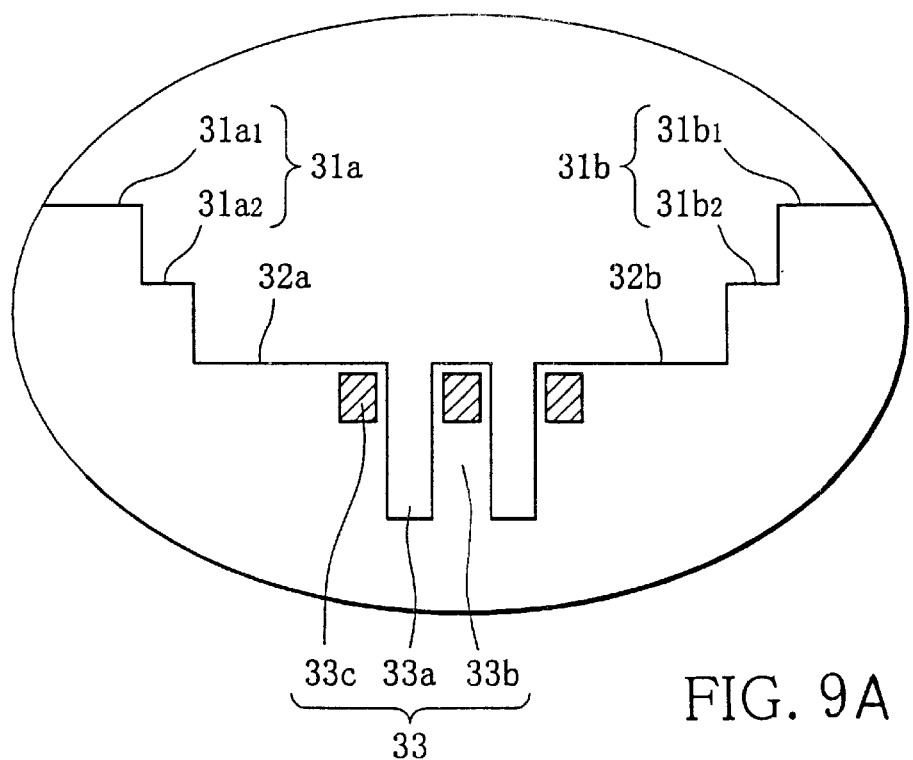
FIG. 9A

N-TYPE MODULATION-DOPED MULTI QUANTUM WELL SEMICONDUCTOR LASER DEVICE

BACKGROUND OF THE INVENTION

1. Field of the Invention

The present invention relates to an n-type modulation-doped multi quantum well semiconductor laser device capable of emitting light a wavelength band of 600 to 1,650 nm, and more specifically, to an n-type modulation-doped multi quantum well semiconductor laser device capable of lasing with higher output power than a conventional semiconductor laser device.

2. Prior Art

In a multi quantum well semiconductor laser device, which can carry out high-output oscillation, an active layer has a multi quantum well (hereinafter referred to as MQW) structure, an alternate hetero-junction structure including well layers and barrier layers. Each well layer has a nanometer thickness and is formed of a semiconductor material with low band gap energy. Each barrier has a nanometer thickness and is formed of another semiconductor material with higher band gap energy than that of each well layer. The semiconductor layer device of this type can oscillate at lower threshold current than a semiconductor laser device that has a bulk active layer.

The multi quantum well semiconductor laser device has a layer structure such that a lower clad layer, a lower optical confinement layer, and the active layer are successively formed on a semiconductor substrate by an epitaxial crystal growth method, and an upper optical confinement layer, an upper clad layer, and a contact layer are successively formed on the active layer.

This layer structure is subjected to cleavage such that a predetermined cavity length is obtained. A single-layer anti-reflection film of, e.g., $SiN_x$ is formed on one cleaved surface (front facet) that serves as an emission end face, and a high-reflection film including alternate layers of, e.g., α-Si and $SiN_x$ is formed on the other cleaved surface (rear facet). Further, an n-type electrode of, e.g., Au—Ge/Ni/Au is formed on the back surface of the semiconductor substrate, and a p-type electrode of, e.g., Ti/Pt/Au is formed on the contact layer with an ohmic junction.

The MQW semiconductor laser device of this type oscillates with higher output power than a semiconductor laser device that has a bulk active layer. However, oscillation with still higher output power is required in the case where the MQW semiconductor laser device is used as a pumping laser device for exciting an Er-doped fiber amplifier (EDFA), for example.

FIG. 1 is a energy band diagram of conduction band showing a layer structure A near the active layer of a high-output MQW semiconductor laser device that oscillates in a wavelength band of 1,300 nm.

The layer structure A is formed between an n-type lower clad layer 1a of n-type InP and a p-type upper clad layer 1b of p-type InP. In this structure A, an active layer having three quantum wells is interposed between lower and upper optical confinement layers 2a and 2b of GaInAsP having a thickness of 120 nm and a band gap wavelength (λg) of 1.1 μm each.

The active layer is composed of well layers 3a of undoped InAsP having a thickness of 8 nm and compression strain of 1.45% and barrier layers 3b of undoped InGaAsP formed between the well layers and having a thickness of 10 nm and a band gap wavelength (μg) of 1.1 μm each.

Uomi theoretically predicted that the laser performance of this MQW structure can be improved by selectively modulation-doping the barrier layers with an n-type dopant without changing the undoped state of the well layers (K. Uomi; Japanese Journal of Applied Physics, vol. 29, No. 1, January 1990, see pp. 81–87).

If the barrier layers are modulation-doped with the n-type dopant, according to this Uomi's theoretical prediction, the necessary injected carrier density for transparency is much lower than in the case where the barrier layers are not modulation-doped (undoped).

In the case of a laser device having the n-type modulation-doped active layer, therefore, the threshold current can be made lower than in the case of a laser device having an undoped MQW structure if a high-reflection film is formed on each facet of the device to lower mirror loss. In the case of an n-type modulation-doped MQW semiconductor laser device proposed by Uomi, however, the cavity length is as short as 200 μm or less, and the threshold current is expected to be adjusted to about 1 mA or less by forming a high-reflection film on each facet of the device.

OBJECTS AND SUMMARY OF THE INVENTION

An object of the present invention is to provide an n-type modulation-doped MQW semiconductor laser device, capable of oscillating with higher output power than a conventional n-type modulation-doped MQW semiconductor laser device by controlling various parameters.

Another object of the invention is to provide an n-type modulation-doped MQW semiconductor laser device, capable of emitting light with various wavelengths in a wavelength band of 600 to 1,650 nm by selecting a semiconductor material for well layers.

In order to achieve the above objects, according to the present invention, there is provided an n-type modulation-doped multi quantum well semiconductor laser device having a multi quantum well structure composed of a hetero-junction structure including well layers and barrier layers, characterized in that:

each of the well layers and each of the barrier layers are formed of an undoped semiconductor material and a semiconductor material modulation-doped with an n-type dopant, respectively;

a low-reflection film and a high-reflection film are formed on the front and rear faces, respectively;

the cavity length is not shorter than 800 μm; and mirror loss ($\alpha_m$) given by $$\alpha_m = (1/2L)\ln\{1/(Rf \times Rr)\},$$

where L, Rf and Rr are the cavity length (cm), reflectance of the front facet, and reflectance of the rear face, respectively, is not higher than 15 cm$^{-1}$.

More specifically, in the n-type modulation-doped multi quantum well semiconductor laser device of the invention, the doping concentration of the n-type dopant in the barrier layers ranges from $5 \times 10^{17}$ to $3 \times 10^{18}$ cm$^{-3}$, and the reflectance (Rf) of the front facet ranges from 1 to 10% and the reflectance (Rr) of the rear facet from 80 to 100%.

In the laser device of the invention, moreover, MQW structure may be composed of a strain-compensating type well layer, the n-type dopant is Si, Se or Sn, preferably, and the well layer or layers are 1 to 15 in number preferably.

Furthermore, according to the present invention, there is provided an n-type modulation-doped multi quantum well semiconductor laser device emitting light in a wavelength band of 1200 to 1650 nm by forming each of the well layers of InAsP, emitting light in a wavelength band of 900 to 1650 nm by forming each of the well layers of GaInNAs, emitting light in a wavelength band of 700 to 1650 nm by forming each of the well layers of GaInAsP, emitting light in a wavelength band of 800 to 1400 nm by forming each of the well layers of GaInAs, and emitting light in a wavelength band of 600 to 1650 nm by forming each of well layers of AlGaInAs, respectively.

BRIEF DESCRIPTION OF THE DRAWINGS

FIG. 5 is a schematic view showing the layer structure of a laser device (Embodiment 1) according to the invention and FIG. 5A is an energy band diagram showing the layer structure of an active layer;

FIG. 8 is a schematic view showing the layer structure of a laser device (Embodiment 2) according to the invention and FIG. 8A is an energy band diagram showing the layer structure of an active layer; and FIG. 9 is a schematic view showing the layer structure of a laser device (Embodiment 3) according to the invention and FIG. 9A is an energy band diagram showing the layer structure of an active layer.

DETAILED DESCRIPTION OF THE INVENTION

In order to achieve the objects described above, the inventors hereof conducted the following experiments and obtained the knowledge mentioned below.

Figure 1:
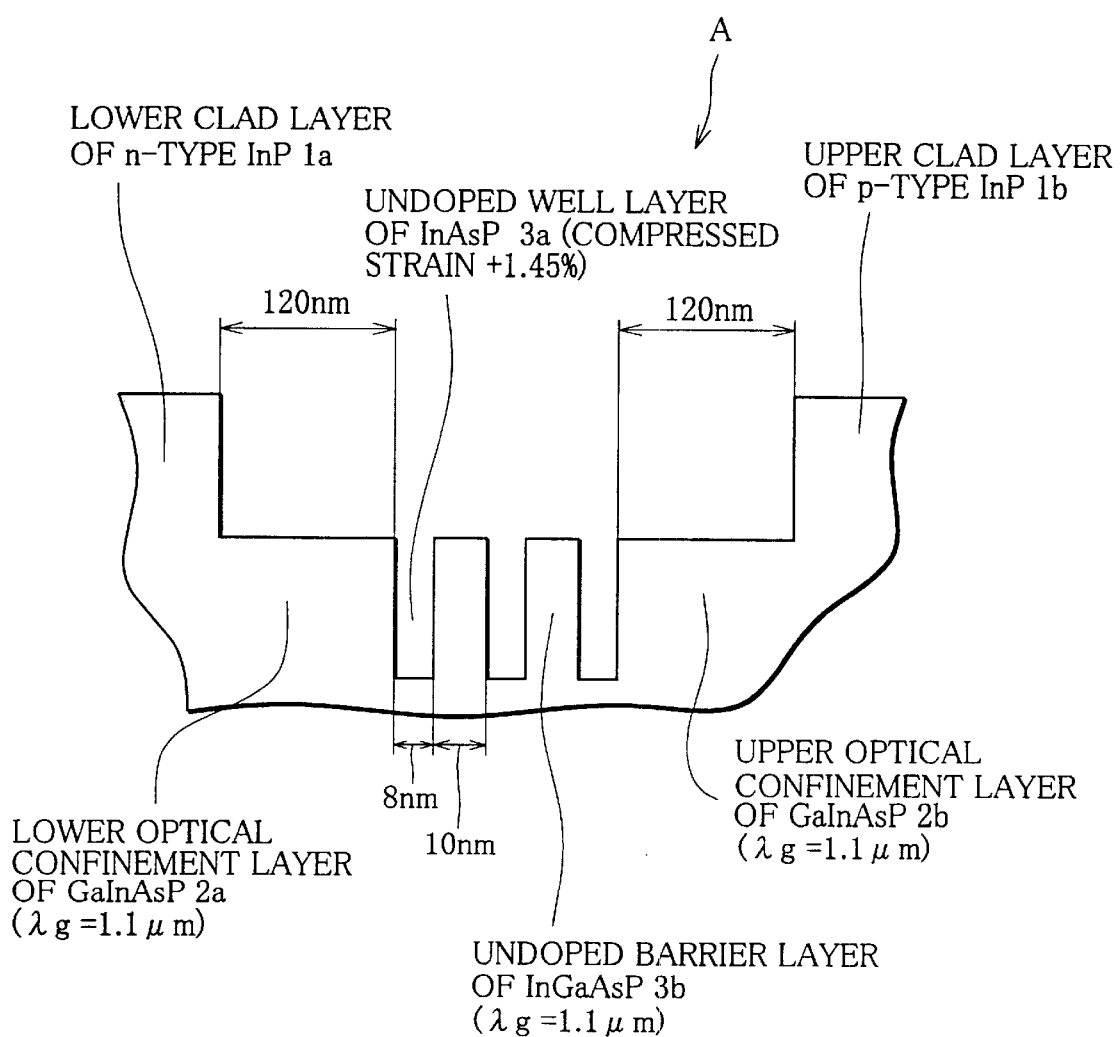
FIG. 1 is an energy band diagram showing a layer structure near an active layer of a conventional undoped MQW semiconductor laser device.

First, in an undoped MQW semiconductor laser device A having a layer structure shown in FIG. 1, the central portion of each barrier layer 3b is selectively modulation-doped with Si as an n-type dopant. By doing this, an n-type modulation-doped MQW semiconductor laser device B was manufactured having a modulation-doped portion of 7 nm thickness.

Figure 2:
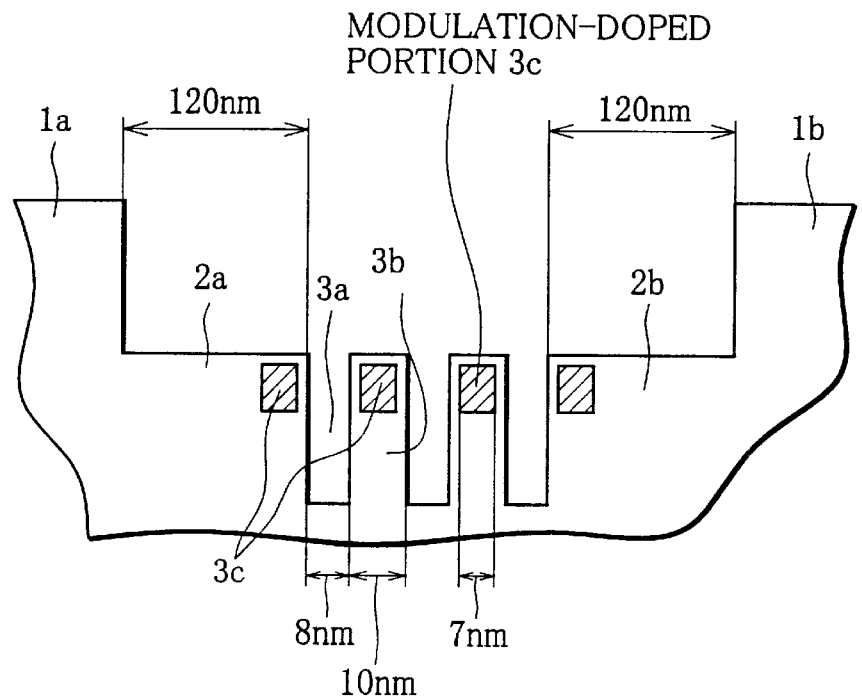
FIG. 2 is an energy band diagram showing a layer structure near an active layer of a laser device according to the present invention.

FIG. 2 is an energy band diagram showing a layer structure near an active layer of the device B. In FIG. 2, a modulation-doped portion 3c of 7 nm thickness is formed in the center of each barrier layer 3b, and modulation-doped portions 3c of 7 nm thickness are also formed individually on lower and upper optical confinement layers 2a and 2b. The modulation-doped portion 3c on each confinement layer is situated at a distance of 1.5 nm from a junction interface of a well layer 3a.

Figure 3:
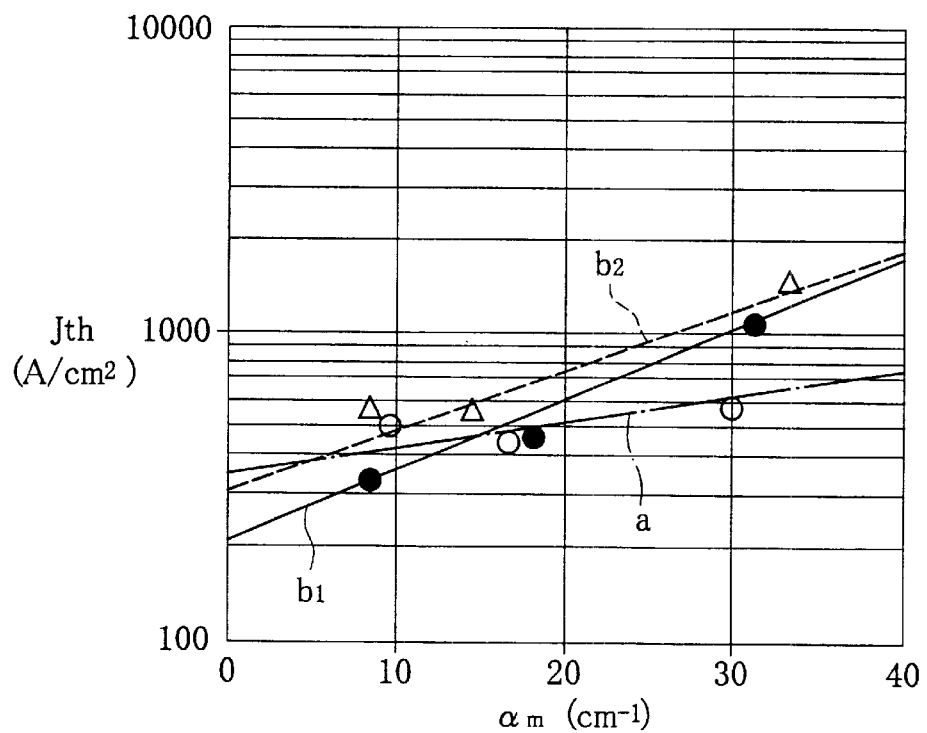
FIG. 3 is a graph showing the relation between threshold current density and mirror loss in an MQW semiconductor laser device.

For the device B and the device A shown in FIG. 1, the relation between mirror loss (cm$^{-1}$) and threshold current density (Jth: A/cm$^2$) was examined. Now, minor loss is defined as follows:

$$\alpha^m = (1/2L) ln\{1/(Rf \times Rr)\}, \quad (1)$$

where L, Rf and Rr are the cavity length (cm), reflectance of the front facet, and reflectance of the rear facet, respectively. FIG. 3 shows the result of the examination.

In FIG. 3, a straight line a marked with ○ represents the case of the undoped device A, a straight line b1 marked with ● represents the case of the device B having the Si modulation doping concentration of $1 \times 10^{18}$ cm$^{-3}$, and a straight line b2 marked with Δ represents the case of the device B having the Si modulation doping concentration of $5 \times 10^{18}$ cm$^{-3}$.

In the case of the device B having the Si modulation doping concentration of $1 \times 10^{18}$ cm$^{-3}$, as seen from FIG. 3, the threshold current density (Jth) is lower than in the case of the undoped device A in a low mirror loss region such that the mirror loss ($\alpha_m$) is lower than 15 cm$^{-1}$. Thus, the threshold carrier density per a well layer is also lower. However, the above-described effect was not able to be obtained with the doping concentration as high as $5 \times 10^{-}$cm$^{-}$3.

If the cavity length (L), reflectance (Rf) of the front facet, and reflectance (Rr) of the rear facet are properly selected so that the mirror loss ($\alpha_m$) is not higher than 15 cm$^{-1}$, and if the barrier layer 3b is modulation-doped with an n-type dopant within the concentration range of $5 \times 10^{17}$ to $3 \times 10^{18}$ cm$^{-3}$, therefore, the threshold injected carrier density per a well layer is lower than in the case of the undoped device, so that a high-output laser device can be obtained.

Figure 4:
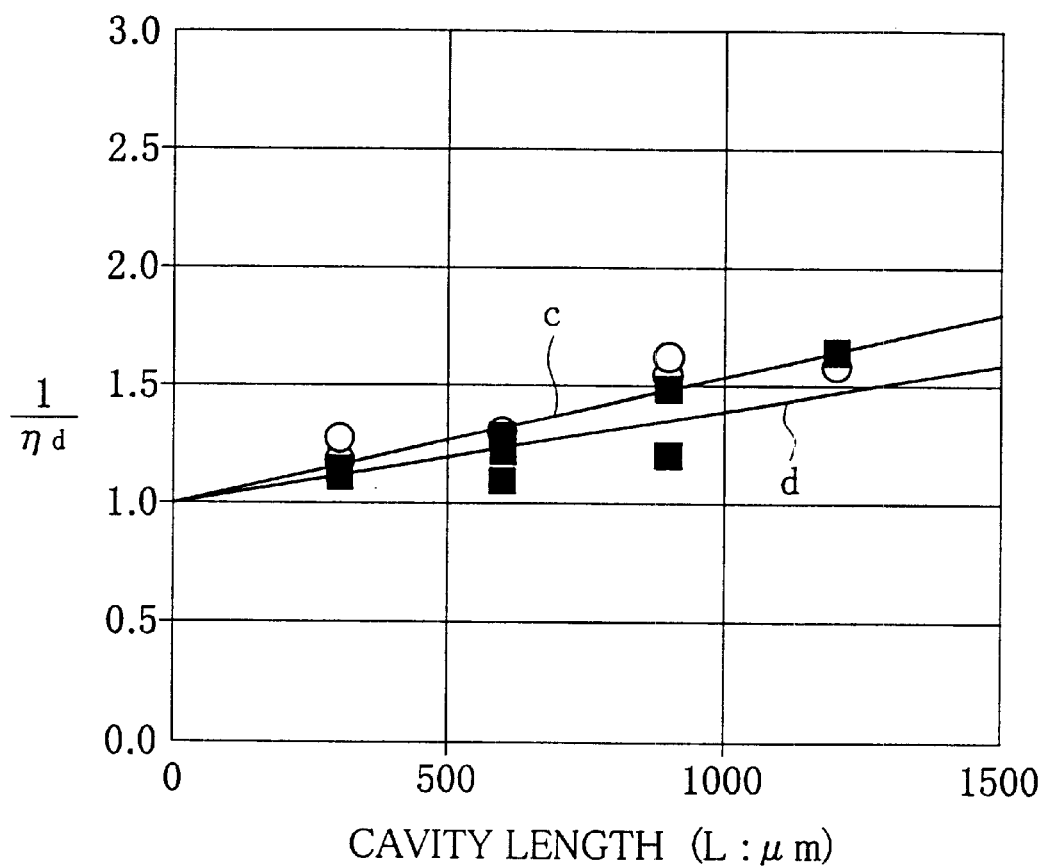
FIG. 4 is a graph showing the relation between the reciprocal of external differential quantum efficiency and cavity length in the MQW semiconductor laser device.

For the device B (with the doping concentration of $1 \times 10^{18}$ cm$^{-3}$) and the device A, moreover, the cavity length (L) was varied, and the relation between the reciprocal of external differential quantum efficiency ($1/\theta_d$) and the cavity length (L) was plotted according to $$1/\theta_d = 1/\theta_i[1 + \alpha_i \times L/\{ln(1/R)\}], \quad (2)$$

where $\theta_i$, R and $\alpha_i$ are the internal efficiency, average reflectance, and internal loss, respectively. FIG. 4 shows the result of the plotting.

In FIG. 4, straight lines c and d marked with ○ and ● represent the cases of the devices A and B, respectively.

The internal loss ($\alpha_i$) was calculated from the gradient of each straight line in FIG. 4. In consequence, the internal losses ($\alpha_i$) of the undoped device A and the device B were estimated at 6.0 cm$^{-1}$ and 4.6 cm$^{-1}$, respectively. Thus, the internal loss ($\alpha_i$) of the device B was found to be about 23% lower than that of the device A.

This indicates that the slope efficiency can be improved for higher output by modulation doping with the n-type dopant at the doping concentration near $1 \times 10^{18}$ cm$^{-3}$, i.e., ranging from $5 \times 10^{17}$ to $3 \times 10^{18}$ cm$^{-3}$.

Further, the inventors hereof are concerned about the fact that the electric resistance of the active layer becomes higher if the cavity length (L) of a high-output laser device to be manufactured is too short, and that the device is subjected to resistance heating by means of current injected from a p-type electrode, thereby causing thermal saturation of the optical output. Further, the inventors hereof investigated the proper cavity length (L) on the assumption that the mirror loss ($\alpha_m$) calculated according to expression (1) is not higher than 15 cm$^{-1}$, and found that the cavity length (L) should be set at 800 μm or more in order to lower the electric resistance of the active layer.

FIG. 5 shows an example of the layer structure of the device according to the present invention. As shown in FIG. 5, a lower clad layer 11a, lower optical confinement layer 12a, active layer 13, upper optical confinement layer 12b, upper clad layer 11b, and contact layer 14 are stacked on a semiconductor substrate 10 in the order named. Any of these layers is composed of a semiconductor material mentioned later, and may be formed by an epitaxial crystal growth method, such as the gas source MBE, MBE, CBE, or MOCVD method.

An electrode (n-type electrode) 15a is formed on the back surface of the substrate 10, and an electrode (p-type electrode) 15b is formed on the contact layer 14 with an ohmic junction. Further, a low-reflection film 16a, e.g., a single layer of $SiN_x$, is formed on a front facet (emission facet) S1, while a high-reflection film 16b, including a plurality of α-Si and $SiN_x$ layers stacked alternately on one another, for example, is formed on a rear facet S2.

The active layer 13 has an MQW structure being formed as a hetero-junction structure, including well layers 13a, which are formed of an undoped semiconductor material, and barrier layers 13b, which are formed of a semiconductor material modulation-doped with an n-type dopant.

The layer structure of the active layer 13 that has the three well layers 13a, as shown in the energy band diagram of FIG. 5, is an MQW structure including the barrier layers 13b, whose central portion constitutes an n-type modulation-doped portion 13c. The well layers are not limited to three in number and may be adjusted to any number ranging from 1 to 15.

In the case shown in FIG. 5A, the modulation-doped portion 13c that is the central part of each barrier layer 13b is subjected to the n-type modulation doping. However, the n-type modulation doping is not limited to this mode, and the whole body of each barrier layer 13b may be doped. Further, the doping area may be situated on one side of each barrier layer, upper or lower, instead of being situated in the central portion.

Si or Se may be used, for example, as the n-type dopant with which the barrier layers 13b are modulation-doped.

The doping concentration of the dopant is adjusted to $5\times10^{17}$ to $3\times10^{18}$ $cm^{-3}$. If the doping concentration is lower than $5\times10^{17}$ $cm^{-3}$, the threshold current density ($J_{th}$) cannot be lower than in the case of the undoped device even though the cavity length (L), reflectance (Rf) of the low-reflection film 16a, and reflectance (Rr) of the high-reflection film 16b are selected so that the mirror loss ($\alpha_m$) calculated according to expression (1) is not higher than 15 $cm^{-1}$. Likewise, if the doping concentration is higher than $3\times10^{18}$ $cm^{-3}$, the threshold current density (Jth) cannot be lower than in the case of the undoped device even though the mirror loss ($\alpha_m$) is adjusted to 15 $cm^{-1}$ or less.

Preferably, the doping concentration ranges from $1\times10^{18}$ to $2\times10^{18}$ $cm^{-3}$.

The active layer 13 may be formed of a strain-compensating MQW, in which the maximum number of wells can be increased to about 30.

The cavity length (L) of the device is set at 800 μm or more. If the cavity length (L) is shorter than 800 μm, the electric resistance of the active layer 13 increases, and the resistance heating of the active layer 13 advances, depending on the level of the injected current, so that thermal saturation of the optical output may be caused in some cases.

Further, the reflectance (Rf) of the anti-reflection film 16a on the front facet is set at 1 to 10%. If the value Rf is lower than 1%, the threshold current density ($J_{th}$) becomes so high that the maximum saturated output cannot be increased. If the value Rf is higher than 10%, on the other hand, the optical output from the front facet (emission facet) is so low that also in this case the maximum saturated output cannot be increased.

The reflectance (Rr) of the high-reflection film 16b on the rear facet is set at 80 to 100%. If the value Rr is lower than 80%, the optical output from the front facet (emission facet) is low, while the optical output from the rear facet increase.

In the laser device according to the present invention, the cavity length (L), reflectance (Rf) of the low-reflection film 16a, and reflectance (Rr) of the high-reflection film 16b are set at their respective values described above. Even in this case, however, these factors should be set individually at values such that the mirror loss ($\alpha_m$) calculated according to expression (1) is not higher than 15 $cm^{-1}$.

If InAsP, GaInNAs, GaInAsP, GaInAs, and AlGaInAs are used as semiconductor materials for the well layers 13a, in the laser device constructed in this manner, lasing can be effected in wavelength bands of 1,200 to 1,650 nm, 900 to 1,650 nm, 700 to 1,650 nm, 800 to 1,400 nm, and 600 to 1,650 nm, respectively.

Embodiment 1

An n-type modulation-doped MQW semiconductor laser device according to the present invention, which has the layer structure shown in FIG. 5 and oscillates in a wavelength band of 1,300 nm, was manufactured in the following manner.

An n-type clad layer 11a of n-type InP with a thickness of 0.6 μm and a lower optical confinement layer 12a of lattice-matched $In_{0.86}Ga_{0.14}As_{0.306}P_{0.694}$ (λg=1.1 μm) with a thickness of 0.12 μm were successively formed on the surface (100) of a substrate 10 of n-type InP, and an active layer 13 (mentioned later) was formed on the resulting structure. Thereafter, an upper optical confinement layer 12b of $In_{0.86}Ga_{0.14}As_{0.306}P_{0.694}$ (λg=1.1 μm) with a thickness of 0.12 μm, a p-type clad layer 11b of p-type InP with a thickness of 2 μm, and a contact layer 14 of p-type InGaAs with a thickness of 0.4 μm were successively formed on the resulting structure.

The active layer 13 is composed of three well layers 13a of undoped $InAs_{0.45}P_{0.55}$ having a thickness of 8 nm and a compression strain of 1.45% and barrier layers 13b of $In_{0.86}Ga_{0.14}As_{0.306}P_{0.694}$ (μg=1.1 μm) formed between the well layers 13a. Each barrier layer 13b has an n-type modulation-doped portion (doping concentration: $1\times10^{18}$ $cm^{-3}$) 13c *of Si with a thickness of* 7 nm in its central portion. Thus, the active layer 13 has the structure shown in the energy band diagram of FIG. 5A.

An embedded hetero device structure having the active layer 13 of 1.2 μm width was manufactured by subjecting the obtained laminated structure to photolithography and mesa etching. In order to lower leak current, moreover, the resulting structure was etched to the level of the substrate 10, leaving a stripe portion of 30 μm width including an embedded hetero structure, whereupon a trench structure was obtained.

Then, a p-type electrode 15b of Ti/Pt/Au (or Au—Zn) was formed on the contact layer 14, and the back surface of the substrate 10 was polished so that the overall thickness of the structure was about 100 μm. Thereafter, an n-type electrode 15a of Au—Ge/Ni/Au was formed on the polished surface.

Figure 6:
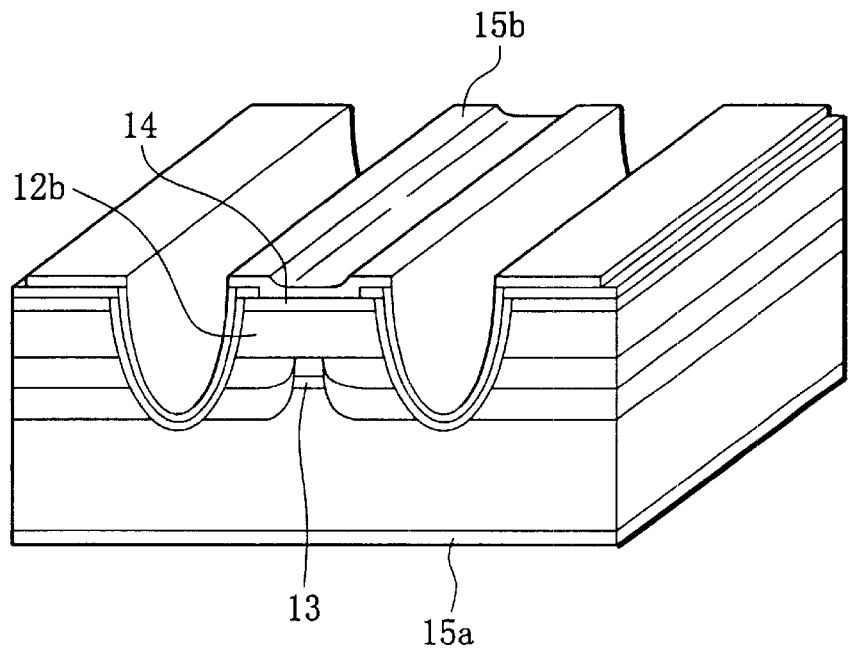
FIG. 6 is a perspective view showing an example of the general construction of the laser device of Embodiment 1.

Thereafter, moreover, the entire structure was cleaved to adjust the cavity length (L) to 1,200 μm, a single layer 16a of $SiN_x$ with the reflectance (Rf) of 5% was formed on the front facet (emission facet) S1, and a high-reflection film 16b of α-Si/$SiN_x$ with the reflectance (Rr) of 96% was formed on the other cleaved surface (rear end face) S2. The device shown in FIG. 6 was manufactured in this manner.

In this device, the mirror loss ($\alpha_m$) calculated according to expression (1) is given by 12.7 $cm^{-1}$ [{1/(2×0.12)}ln{1/(0.05×0.96)}].

For comparison, a laser device (undoped) was constructed in the same manner as in Embodiment 1 except that the barrier layer 13b was not formed with the modulation-doped portion 13c.

Figure 7:
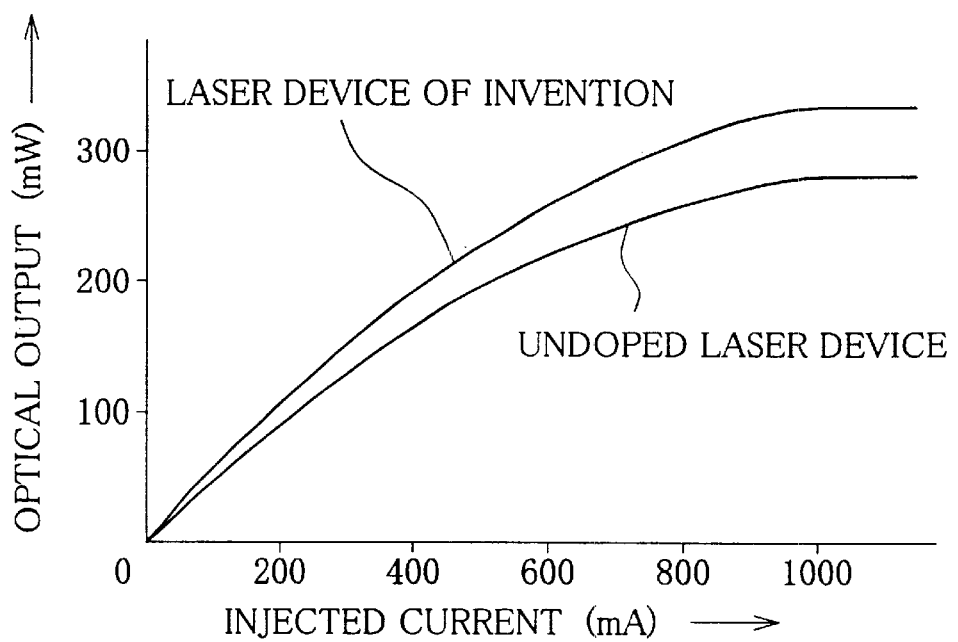
FIG. 7 is a graph showing the optical output-current characteristics of the laser device of Embodiment 1.
Figure 1:
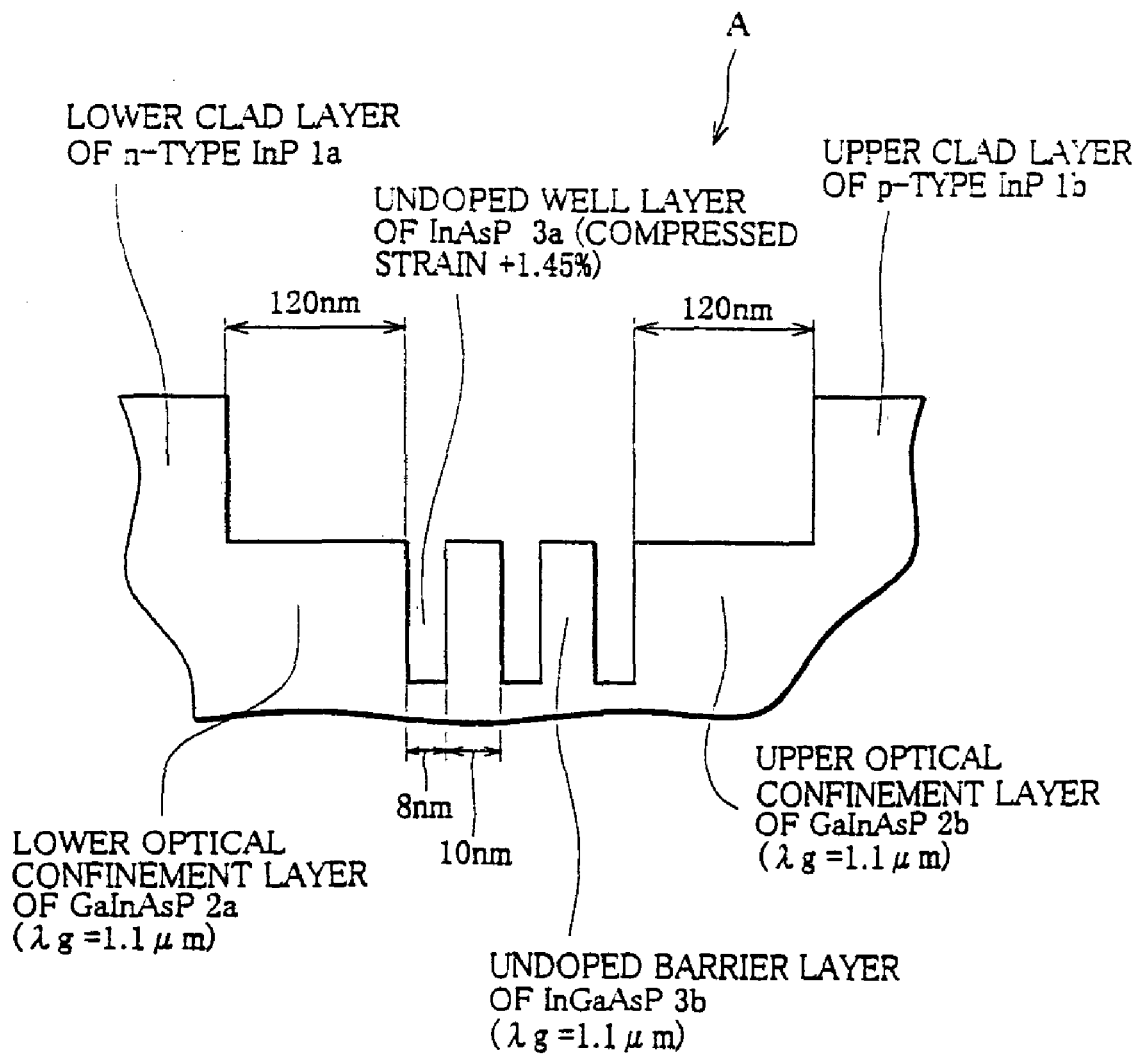
Figure 2:
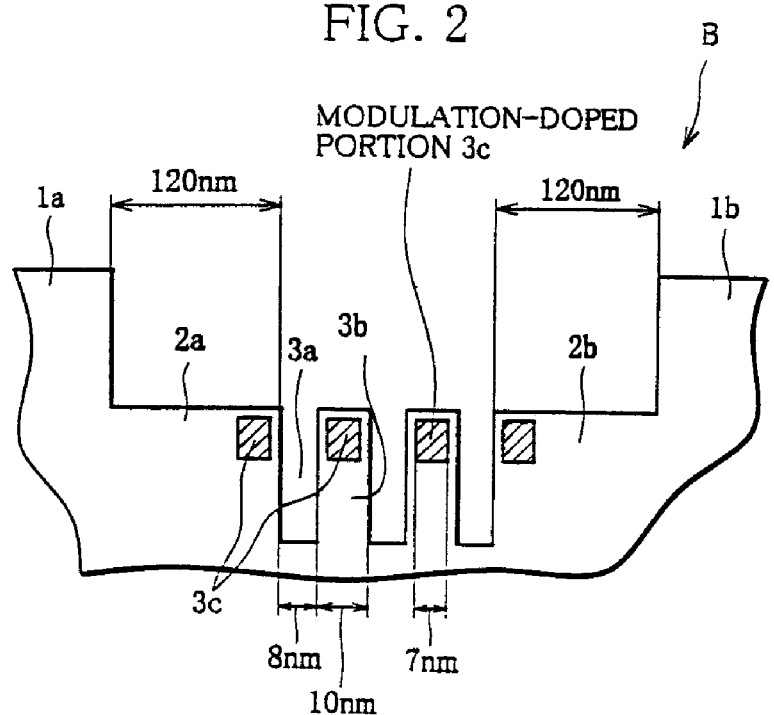
Figure 3:
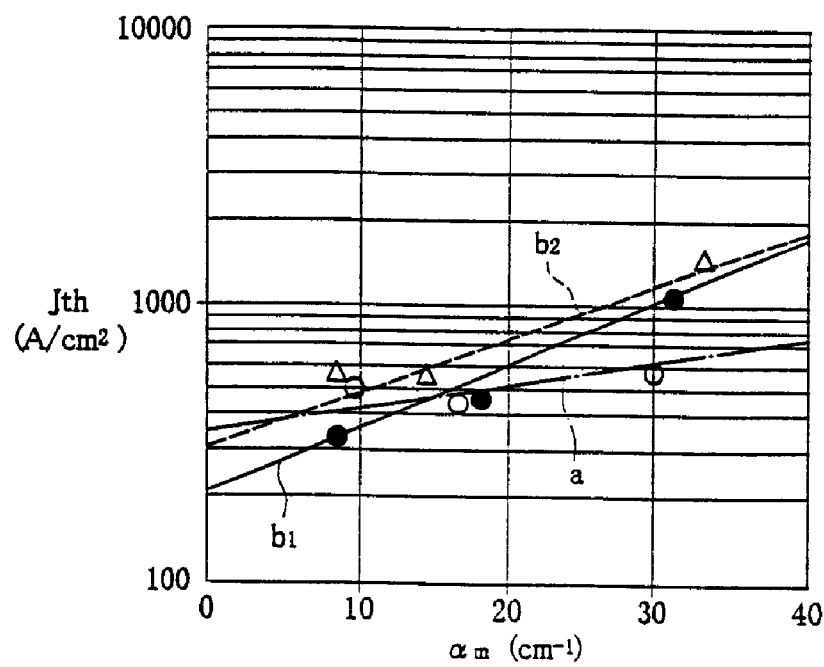

These two types of laser devices were checked for their optical output-current characteristics. FIG. 7 shows the result of the check. In either of these laser devices, as seen from FIG. 7, the optical output is saturated when the injected current is at about 1A. While the optical output of the conventional undoped laser device is about 280 mW, that of the laser device of Embodiment 1 is about 330 mW, thus ensuring higher output performance.

According to the embodiment described above, the lattice-matched material with $\lambda g=1.1$ $\mu$m was used as the semiconductor material for the barrier layer. Alternatively, however, a material having $\lambda g$ of 0.65 $\mu$m or more and a band gap wavelength shorter than that of the well layers 13a may be used for the purpose. Further, the material is not limited to the lattice-matched type, and may be a strain-type material. Although InAsP was used for the well layers, moreover, GaInAsP, AlGaInAs, or GaInNAs may be used instead.

Although InP was used for the n- and p-type clad layer 11a and 11b, $Al_{0.48}In_{0.52}As$ that is lattice-matched to InP may be used instead. Furthermore, GRIN-SCH may be used in place of SCH for the optical confinement layers.

Embodiment 2

An n-type modulation-doped MQW semiconductor laser device according to the present invention, which has the layer structure shown in FIG. 8 and oscillates in a wavelength band of 1,480 nm, was manufactured in the following manner.

An n-type clad layer 11a of n-type InP with a thickness of 0.6 $\mu$m, lower GRIN-SCH 21a, active layer 22, and upper GRIN-SCH 21b were successively formed on the surface (100) of a substrate 10 of n-type InP, and a p-type clad layer 11b of p-type InP with a thickness of 2 $\mu$m and a contact layer 14 of p-type InGaAs with a thickness of 0.4 $\mu$m were successively formed on the resulting structure.

The lower GRIN-SCH 21a is a layer obtained by stacking a layer $21a_1$ of lattice-matched $In_{0.86}Ga_{0.14}As_{0.306}P_{0.694}$ ($\lambda g=1.1$ $\mu$m) with a thickness of 20 nm and a layer $21a_2$ of lattice-matched $In_{0.792}Ga_{0.208}As_{0.453}P_{0.547}$ ($\lambda g=1.2$ $\mu$m) with a thickness of 20 nm in the order named. The upper GRIN-SCH 21b and the lower GRIN-SCH 21a are symmetrical with respect to the active layer 22, which will be described below. More specifically, the upper GRIN-SCH 21b is a layer obtained by stacking a layer $21b_2$ of lattice-matched $In_{0.792}Ga_{0.208}As_{0.453}P_{0.547}$ ($\lambda g=1.2$ $\mu$m) with a thickness of 20 nm and a layer $21b_1$ of lattice-matched $In_{0.86}Ga_{0.14}As_{0.306}P_{0.694}$ ($\lambda g$) =1.1 $\mu$m) with a thickness of 20 nm in the order named.

The active layer 22 is composed of five well layers 22a of undoped $Ga_{0.183}In_{0.817}As_{0.699}P_{0.301}$ ($\lambda g=1.55$ $\mu$m) having a thickness of 4 nm and compression strain of 1% and barrier layers 22b of $In_{0.792}Ga_{0.208}As_{0.453}P0_{0.547}$ ($\mu g=1.2$ $\mu$m) with a thickness of 10 nm formed between the well layers 22a. Each barrier layer 22b has an n-type modulation-doped portion (doping concentration: $1\times10^{18}$ cm$^{-3}$) 22c of Si with a thickness of 7 nm in its central portion. Thus, the active layer 22 has the structure shown in the energy band diagram of FIG. 8A.

An embedded hetero device structure having the active layer 22 of 1.2 $\mu$m width was manufactured by subjecting the obtained laminated structure to photolithography and mesa etching. A trench structure was obtained in the same manner as in the case of Embodiment 1.

Then, a p-type electrode 15b of Ti/Pt/Au (or Au—Zn) was formed on the contact layer 14, and the back surface of the substrate 10 was polished so that the overall thickness of the structure was about 100 $\mu$m. Thereafter, an n-type electrode 15a of Au—Ge/Ni/Au was formed on the polished surface.

Thereafter, moreover, the entire structure was cleaved to adjust the cavity length (L) to 1,200 $\mu$m, a single layer 16a of SiN$_x$ with the reflectance (Rf) of 5% was formed on the front facet (emission facet) S1, and a high-reflection film 16b of $\alpha$-Si/SiN$_x$ with the reflectance (Rr) of 96% was formed on the other cleaved surface (rear end face) S2. The device having the general structure shown in FIG. 6 was manufactured in this manner.

The mirror loss ($\alpha_m$) of this device is 12.7 cm$^{-1}$.

The obtained device was checked for its optical output-current characteristics. Thereupon, the saturated optical output was found to be increased by about 15% compared with undoped laser, thus ensuring higher output performance of the device, as in the case of Embodiment 1.

Embodiment 3

An n-type modulation-doped MQW semiconductor laser device according to the present invention, which has the layer structure shown in FIG. 9 and oscillates in a wavelength band of 980 nm, was manufactured in the following manner.

A lower clad layer $31a_1$ of n-type $Al_{0.3}Ga_{0.7}As$, lower optical confinement layer $32a_2$ of n-type $Al_{0.1}Ga_{0.9}As$ with a thickness of 30 nm, optical confinement layer 32a of GaAs with a thickness of 15 nm, active layer 33, optical confinement layer 32b of GaAs with a thickness of 15 nm, upper optical confinement layer $32b_2$ of p-type $Al_{0.1}Ga_{0.9}As$ with a thickness of 15 nm, and upper clad layer $31b_1$ of p-type $Al_{0.3}Ga_{0.7}As$ were successively formed on the surface (100) of a substrate 30 of n-type GaAs, and a contact layer 34 of p-type GaAs with a thickness of 0.3 $\mu$m were successively formed on the resulting structure.

The active layer 33 is composed of two well layers 33a of undoped $Ga_{0.81}In_{0.19}As$ having a thickness of 7 nm and a compression strain of 1.4% and a barrier layer 33b of GaAs with a thickness of 10 nm formed between the well layers 33a. The barrier layer 33b has an n-type modulation-doped portion (doping concentration: $1\times10^{18}$ cm$^{-3}$) 33c of Si with a thickness of 7 nm in its central portion. Thus, the active layer 33 has the structure shown in the energy band diagram of FIG. 9A.

A ridge-waveguide laser device with the active layer width of 3 $\mu$m was manufactured by subjecting the obtained laminated structure to photolithography and mesa etching. The resonator length (L) was adjusted to 1,000 $\mu$m.

The reflectance of the front facet was set at 8%, and the reflectance of the rear facet was set at 96%.

The mirror loss ($\alpha_m$) of this device is 12.8 cm$^{-1}$.

The obtained device was checked for its optical output-current characteristics. Thereupon, the saturated optical output was found to be increased by about 15% compared with undoped laser, thus ensuring higher output performance of the device, as in the case of Embodiment 1.

Although embedded hetero device structures have mainly been described in connection with the foregoing embodiments, the device structure of the present invention may alternatively be a ridge-waveguide device structure or of the TJS type.

Further, the laser devices according to the embodiments described herein are designed to oscillate in the wavelength bands of 1,300 nm, 1,480 nm, and 980 nm. However, the laser device structure of the present invention may be also applied to MQW laser devices with wavelength bands of 1,650 nm, 1,550 nm, 850 nm, 780 nm, 680 nm, 630 nm, and 600 nm. In the case where the wavelength band is a short wavelength region ranging from 600 to 1,000 nm, it is advisable mainly to use GaAs for the substrate.

What is claimed is:

1. An n-type modulation-doped multi quantum well semiconductor laser device comprising a multi quantum well structure comprising a hetero-junction structure including well layers and barrier layers, wherein each said well layer is formed of an undoped semiconductor material and each said barrier layer is formed of a semiconductor material modulation-doped with an n-type dopant, and an anti-reflection film formed on a front facet and a high-reflection film formed on a rear facet, the device having a cavity length which is not shorter than 800 μm;

the device having a mirror loss ($\alpha_m$) which is not higher than 15 cm$^{-1}$ and which is given by the following formula:

$$\alpha_m = (1/2L)\ln\{1/(Rf \times Rr)\},$$

where L is the cavity length in cm, Rf is the reflectance of the front facet, and Rr is the reflectance of the rear facet.

2. The n-type modulation-doped multi quantum well semiconductor laser device according to claim 1, wherein the doping concentration of the n-type dopant in each said barrier layer ranges from 5×10$^{17}$ to 3×10$^{18}$ cm$^{-3}$.

3. The n-type modulation-doped multi quantum well semiconductor laser device according to claim 1, wherein the doping concentration of the n-type dopant in each said barrier layer ranges from 1×10$^{18}$ to 2×10$^{18}$ cm$^{-3}$.

4. The n-type modulation-doped multi quantum well semiconductor laser device according to claim 1, wherein the reflectance (Rf) of the front facet ranges from 1 to 10% and the reflectance (Rr) of the rear facet ranges from 80 to 100%.

5. The n-type modulation-doped multi quantum well semiconductor laser device according to claim 1, wherein said n-type dopant is Si, Se or Sn.

6. The n-type modulation-doped multi quantum well semiconductor laser device according to claim 1, wherein said well layer or layers are 1 to 15 in number.

7. The n-type modulation-doped multi quantum well semiconductor laser device according to claim 1, wherein said MQW structure is a strain-compensating type MQW structure.

8. The n-type modulation-doped multi quantum well semiconductor laser device according to any one of claims 1 to 7 wherein each said well layer comprises InAsP and emits light in a wavelength band of 1,200 to 1,650 nm.

9. The n-type modulation-doped multi quantum well semiconductor laser device according to any one of claims 1 to 7 wherein each said well layer comprises GaInNAs and emits light in a wavelength band of 900 to 1,650 nm.

10. The n-type modulation-doped multi quantum well semiconductor laser device according to any one of claims 1 to 7 wherein each said well layer comprises GaInNAs and emits light in a wavelength band of 700 to 1,650 nm.

11. The n-type modulation-doped multi quantum well semiconductor laser device according to any one of claims 1 to 7 wherein each said well layer comprises GaInNAs and emits light in a wavelength band of 800 to 1,400 nm.

12. The n-type modulation-doped multi quantum well semiconductor laser device according to any one of claims 1 to 7 wherein each said well layer comprises AlGaInAs and emits light in a wavelength band of 600 to 1,650 nm.

* * * * *

UNITED STATES PATENT AND TRADEMARK OFFICE
CERTIFICATE OF CORRECTION

PATENT NO. : 6,396,861 B1
DATED : May 28, 2002
INVENTOR(S) : Hitoshi Shimizu et al.

It is certified that error appears in the above-identified patent and that said Letters Patent is hereby corrected as shown below:

Drawings,
Fig. 1, insert -- Conventional Undoped MQW Semiconductor Device -- (as shown on the attached page).
Fig. 2, add -- B -- with a line having an arrow to the right of the following description in Fig. 2: "MODULATION-DOPED PORTION 3c" (as shown on the attached page).

Signed and Sealed this

Nineteenth Day of October, 2004

JON W. DUDAS
*Director of the United States Patent and Trademark Office*

Conventional Undoped MQW Semiconductor Device